United States Patent
Cai et al.

(10) Patent No.: US 10,236,366 B2
(45) Date of Patent: Mar. 19, 2019

(54) SEMICONDUCTOR-ON-INSULATOR LATERAL HETEROJUNCTION BIPOLAR TRANSISTOR HAVING EPITAXIALLY GROWN INTRINSIC BASE AND DEPOSITED EXTRINSIC BASE

(71) Applicant: INTERNATIONAL BUSINESS MACHINES CORPORATION, Armonk, NY (US)

(72) Inventors: Jin Cai, Cortlandt Manor, NY (US); Kevin K. Chan, Staten Island, NY (US); Christopher P. D'Emic, Ossining, NY (US); Tak H. Ning, Yorktown Heights, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/847,177

(22) Filed: Dec. 19, 2017

(65) Prior Publication Data
US 2018/0108763 A1 Apr. 19, 2018

Related U.S. Application Data

(62) Division of application No. 14/867,384, filed on Sep. 28, 2015, now Pat. No. 9,887,278.

(51) Int. Cl.
*H01L 29/66* (2006.01)
*H01L 29/737* (2006.01)
(Continued)

(52) U.S. Cl.
CPC ........ *H01L 29/737* (2013.01); *H01L 29/1008* (2013.01); *H01L 29/42304* (2013.01);
(Continued)

(58) Field of Classification Search
CPC ............... H01L 29/737; H01L 29/7375; H01L 29/0808; H01L 29/0817; H01L 29/0649; H01L 29/66242; H01L 2924/13051
See application file for complete search history.

(56) References Cited

U.S. PATENT DOCUMENTS

| 6,384,469 B1 | 5/2002 | Chantre |
| 6,492,238 B1 | 12/2002 | Ahlgren et al. |

(Continued)

OTHER PUBLICATIONS

List of IBM Patents or Patent Applications Treated as Related dated Dec. 19, 2017, 2 pages.

*Primary Examiner* — Matthew E. Gordon
(74) *Attorney, Agent, or Firm* — Scully, Scott, Murphy & Presser, P.C.; L. Jeffrey Kelly, Esq.

(57) ABSTRACT

After forming a trench extending through an insulator layer and an underlying top semiconductor portion that is comprised of a first semiconductor material and a dopant of a first conductivity type to define an emitter and a collector on opposite sides of the trench in the top semiconductor portion, an intrinsic base comprising a second semiconductor material having a bandgap less than a bandgap of the first semiconductor material and a dopant of a second conductivity type opposite the first conductivity type is formed in a lower portion the trench by selective epitaxial growth. The intrinsic base protrudes above the top semiconductor portion and is laterally surrounded by entire top semiconductor portion and a portion of the insulator layer. An extrinsic base is then formed on top of the intrinsic base to fill a remaining volume of the trench by a deposition process.

18 Claims, 9 Drawing Sheets

(51) Int. Cl.
  *H01L 29/423* (2006.01)
  *H01L 29/735* (2006.01)
  *H01L 29/10* (2006.01)
(52) U.S. Cl.
  CPC .... *H01L 29/6625* (2013.01); *H01L 29/66242* (2013.01); *H01L 29/735* (2013.01)

(56) References Cited

U.S. PATENT DOCUMENTS

| | | |
|---|---|---|
| 7,521,734 B2 | 4/2009 | Oue et al. |
| 7,625,792 B2 | 12/2009 | Geiss et al. |
| 7,816,221 B2 | 10/2010 | John et al. |
| 7,972,919 B2 | 7/2011 | Gray et al. |
| 8,288,758 B2 | 10/2012 | Ning et al. |
| 8,441,084 B2 | 5/2013 | Cai et al. |
| 8,569,866 B2 | 10/2013 | Suligoj et al. |
| 8,785,945 B2 | 7/2014 | Konstantinov |
| 8,921,195 B2 | 12/2014 | Cheng et al. |
| 9,111,986 B2 | 8/2015 | Camillo-Castillo et al. |
| 2008/0203434 A1 * | 8/2008 | Meunier-Beillard ........ H01L 29/0817 257/197 |
| 2012/0139009 A1 * | 6/2012 | Ning ............... H01L 29/0808 257/197 |
| 2013/0256757 A1 * | 10/2013 | Cai ............... H01L 29/42304 257/197 |
| 2013/0313614 A1 | 11/2013 | Fu et al. |
| 2014/0175520 A1 | 6/2014 | Fu et al. |
| 2014/0370683 A1 | 12/2014 | Cheng |
| 2014/0374802 A1 | 12/2014 | Harame et al. |

* cited by examiner

ISEMICONDUCTOR-ON-INSULATOR
LATERAL HETEROJUNCTION BIPOLAR
TRANSISTOR HAVING EPITAXIALLY
GROWN INTRINSIC BASE AND DEPOSITED
EXTRINSIC BASE

BACKGROUND

The present application relates to a lateral heterojunction bipolar transistor (HBT) structure, and particularly to a lateral HBT including an epitaxially grown intrinsic base and a deposited extrinsic base that is self-aligned with the intrinsic base and methods of manufacturing the same.

Heterojunction bipolar transistors (HBTs) include a heterojunction, i.e., a junction of two semiconductor materials having different band gaps, which coincides with a p-n junction between the base and the emitter. The wider bandgap of the emitter relative to the bandgap of the base in an HBT increases the current gain relative to a bipolar junction transistor employing a same semiconductor material across the base and the emitter and having similar physical dimensions and doping profiles for the base and emitter.

Heterojunction bipolar transistors (HBTs) known in the art include a pair of heterojunctions, i.e., junctions of two semiconductor materials having different bandgaps, which coincide with p-n junctions between the base and the emitter/collector. The wider bandgap of the emitter relative to the bandgap of the base in an HBT increases the current gain relative to a bipolar junction transistor employing a same semiconductor material across the base and the emitter and having similar physical dimensions and doping profiles for the base and emitter.

However, there can be difficulties associated with the manufacturing of the HBTs and with the functioning of HBTs. For instance, and in the conventional art, the base is formed first which, in turn, may require additional patterning (e.g., lithography and reactive ion etching (RIE)) in order to enable deposition or epitaxial growth of the emitter/collector material to form an HBT having an emitter/collector including materials with a wider bandgap than that for an intrinsic base, thereby resulting in a more complicated process for forming the HBT. Moreover, the thermal cycles involved in formation of emitter/collector could compromise the integration of the intrinsic base. Therefore, there remains a need to develop a method that can simplify the fabrication and improve the device performance of the HBTs.

SUMMARY

The present application provides a lateral heterojunction bipolar transistor (HBT) including an epitaxially grown intrinsic base and a deposited extrinsic base above the intrinsic base that is self-aligned with the intrinsic base. After forming a trench extending through an insulator layer and an underlying top semiconductor portion that is comprised of a first semiconductor material and a dopant of a first conductivity type to define an emitter and a collector on opposite sides of the trench in the top semiconductor portion, an intrinsic base comprising a second semiconductor material having a bandgap less than a bandgap of the first semiconductor material and a dopant of a second conductivity type opposite the first conductivity type is formed in a lower portion the trench by selective epitaxial growth. The intrinsic base protrudes above the top semiconductor portion and is laterally surrounded by entire top semiconductor portion and a portion of the insulator layer. An extrinsic base is then formed on top of the intrinsic base to fill a remaining volume of the trench by a deposition process. The extrinsic base thus formed is fully self-aligned with the intrinsic base with no overlap to the emitter and the collector, thereby minimizing parasitic capacitance between the extrinsic base, the emitter, and/or collector.

According to an aspect of the present application, a method of forming a semiconductor structure is provided. The method includes first forming a trench extending through a stack of, from bottom to top, a semiconductor portion and an insulator layer located on a substrate. The semiconductor portion is comprised of a first semiconductor material of a first conductivity type. Next, an intrinsic base comprised of a second semiconductor material of a second conductivity type is formed within the trench. The intrinsic base fills a portion of the trench and has a top surface located above a top surface of the semiconductor portion. The second conductive type is opposite to the first conductivity type. Subsequently, an extrinsic base comprised of a third semiconductor material of the second conductivity type is formed over the intrinsic base. The extrinsic base has a top surface coplanar with a top surface of the insulator layer and sidewalls vertically coincident with sidewalls of the intrinsic base.

According to another aspect of the present application, a semiconductor structure is provided. The semiconductor structure includes an emitter and a collector spaced apart from each other and located on a buried insulator layer. The emitter and the collector are comprised of a first semiconductor material of a first conductivity type. The semiconductor structure also includes an intrinsic base comprised of a second semiconductor material of a second conductivity type opposite to the first conductivity type disposed in between the emitter and the collector and on the buried insulator layer. A portion of the intrinsic base protrudes above the emitter and a collector. The semiconductor structure further includes an extrinsic base comprised of a third semiconductor material of the second conductivity type disposed on a top surface of the intrinsic base. Sidewalls of the extrinsic base are vertically coincident with sidewalls of the intrinsic base.

BRIEF DESCRIPTION OF SEVERAL VIEWS OF
THE DRAWINGS

DETAILED DESCRIPTION

Figure 1A:
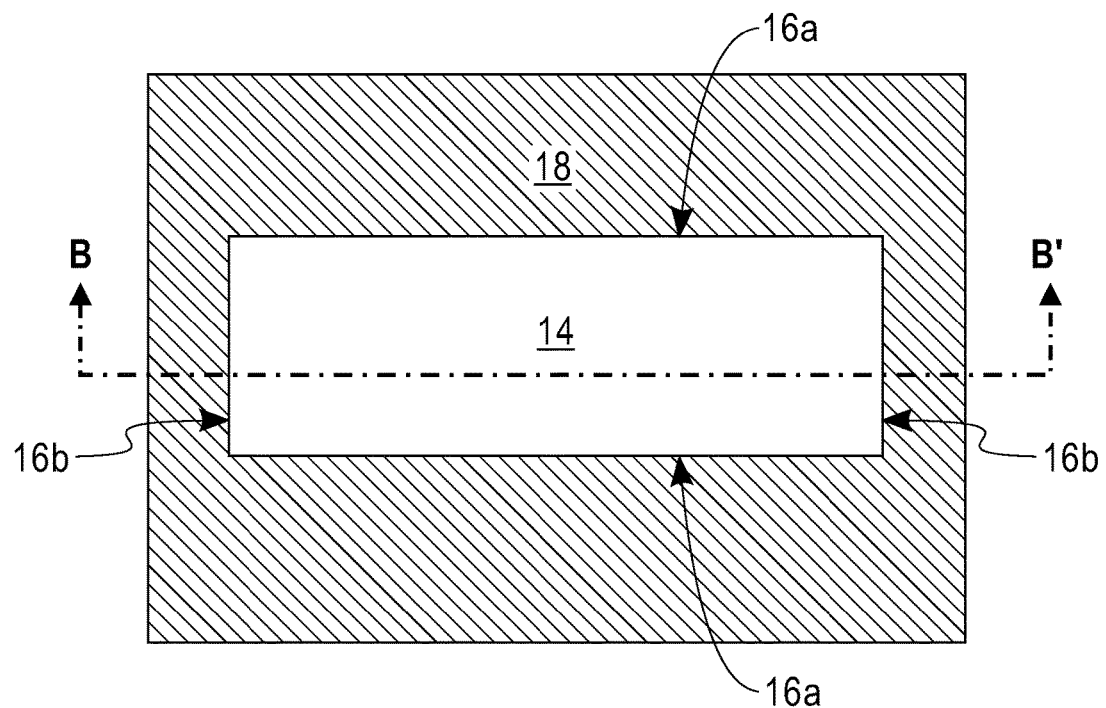
FIG. 1A is a top view of an exemplary semiconductor structure including a substrate having a top semiconductor portion and a shallow trench isolation (STI) structure formed thereon according to an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1B:
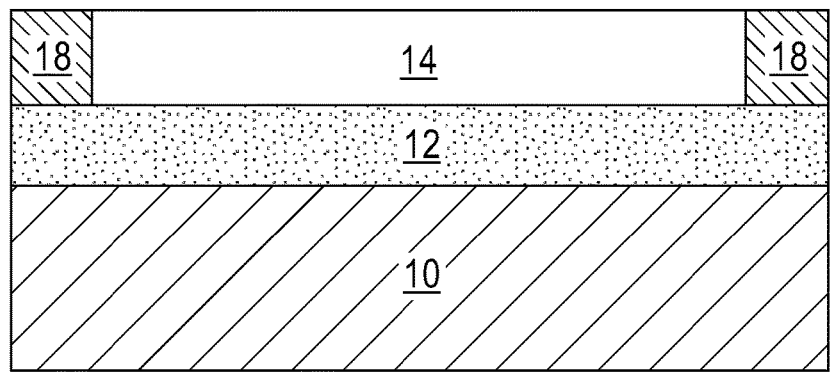
FIG. 1B is a cross-sectional view of the exemplary semiconductor structure along the vertical plane B-B' of FIG. 1A.

Referring to FIGS. 1A and 1B, an exemplary semiconductor structure according to an embodiment of the present application includes a substrate having a top semiconductor portion 14 and a shallow trench isolation (STI) structure 18 formed within the substrate. In one embodiment of the present application, and as shown in FIG. 1B, the top semiconductor portion 14 can be formed by patterning a top semiconductor layer of a semiconductor-on-insulator (SOI) substrate. The SOI substrate includes, from bottom to top, a handle substrate 10, a buried insulator layer 12 and a top semiconductor layer (not shown) from which the top semiconductor portion 14 is formed.

The handle substrate 10 may include a semiconductor material, such as, for example, silicon (Si), silicon germanium (SiGe), silicon germanium carbide (SiGeC), silicon carbide (SiC), an III-V compound semiconductor, an II-VI compound semiconductor or any combinations thereof. Multilayers of semiconductor materials can also be used as the semiconductor material of the handle substrate 10. In one embodiment, the handle substrate 10 is composed of single crystalline silicon. The thickness of the handle substrate 10 can be from 50 µm to 2 mm, although lesser and greater thicknesses can also be employed.

The buried insulator layer 12 may include a dielectric material such as silicon oxide, silicon nitride, silicon oxynitride, boron nitride or a combination thereof. In one embodiment, the buried insulator layer 12 may be formed by a deposition process, such as chemical vapor deposition (CVD) or physically vapor deposition (PVD). In another embodiment, the buried insulator layer 12 may be formed using a thermal growth process, such as thermal oxidation, to convert a surface portion of the handle substrate 10. The thickness of the buried insulator layer 12 that is formed can be from 50 nm to 200 nm, although lesser or greater thicknesses can also be employed.

The top semiconductor layer may include any semiconductor material as mentioned above for the handle substrate 10. Exemplary semiconductor materials that can be employed as the top semiconductor layer include, but are not limited to, Si, Ge, SiGe, SiC and SiGeC, and III/V compound semiconductors such as, for example, InAs, GaAs, and InP. The semiconductor materials of the top semiconductor layer and the handle substrate 10 may be the same or different. In one embodiment, the top semiconductor layer includes a single crystalline semiconductor material such as, for example, single crystalline silicon. The top semiconductor layer may be doped with a dopant of a first conductivity type, which can be p-type or n-type. In one embodiment, the dopant may be a p-type dopant including, but not limited to, boron (B), aluminum (Al), gallium (Ga) and indium (In). In another embodiment, the dopant may be an n-type dopant including, but not limited to, antimony (Sb), arsenic (As) and phosphorous (P). The dopant concentration in the top semiconductor layer can range from $1\times10^{18}$ atoms/cm$^3$ to $5\times10^{21}$ atoms/cm$^3$, although lesser and greater dopant concentrations can also be employed.

The top semiconductor layer can be provided as an intrinsic single crystalline semiconductor layer and is subsequently doped with a dopant of the first conductivity type, or can be provided as a doped single crystalline semiconductor layer with a dopant of the first conductivity type. The top semiconductor layer can be formed by a deposition process, such as CVD or plasma enhanced chemical vapor deposition (PECVD). The top semiconductor layer that is formed may have a thickness from 20 nm to 600 nm, although lesser or greater thicknesses can also be employed. Alternatively, the top semiconductor layer may be formed using a smart cut process where two semiconductor wafers are bonded together with an insulator in between.

The STI structure 18 can be formed, for example, by forming a shallow trench laterally surrounding a portion of the top semiconductor layer (i.e., the top semiconductor portion 14) and filling the shallow trench with a dielectric material such as, for example, silicon oxide, silicon nitride or silicon oxynitride. The shallow trench can be formed, for example, by applying and lithographically patterning a photoresist layer (not shown), and transferring the pattern in the photoresist layer through the top semiconductor layer to expose a top surface of the buried insulator layer 12. After removing the remaining photoresist layer, the dielectric material is deposited in the shallow trench, for example, by CVD and excess dielectric material above the top surface of the top semiconductor layer is removed, for example, by chemical mechanical planarization (CMP) to form the STI structure 18. The top surface of the STI structure 18 can be coplanar with the top surface of the top semiconductor portion 14. The remaining portion of the top semiconductor layer that is laterally surrounded by the STI structure 18 constitutes the top semiconductor portion 14.

The top semiconductor portion 14 has a pair of first sidewalls 16a and a pair of second sidewalls 16b. In one embodiment and as shown in FIG. 1A, the first sidewalls 16a are lengthwise sidewalls and the second sidewalls 16b are widthwise sidewalls. As used herein, a "lengthwise direction" of an element refers to a direction about which the element extends the most. As used herein, a "lengthwise sidewall" of an element refers to a sidewall of an element that extends along the lengthwise direction of the element. As used herein, a "widthwise sidewall" of an element refers to a sidewall of the element that extends along a horizontal direction that is perpendicular to the lengthwise direction of the element. In one embodiment, the top semiconductor portion 14 can have a rectangular horizontal cross-sectional shape.

Figure 2A:
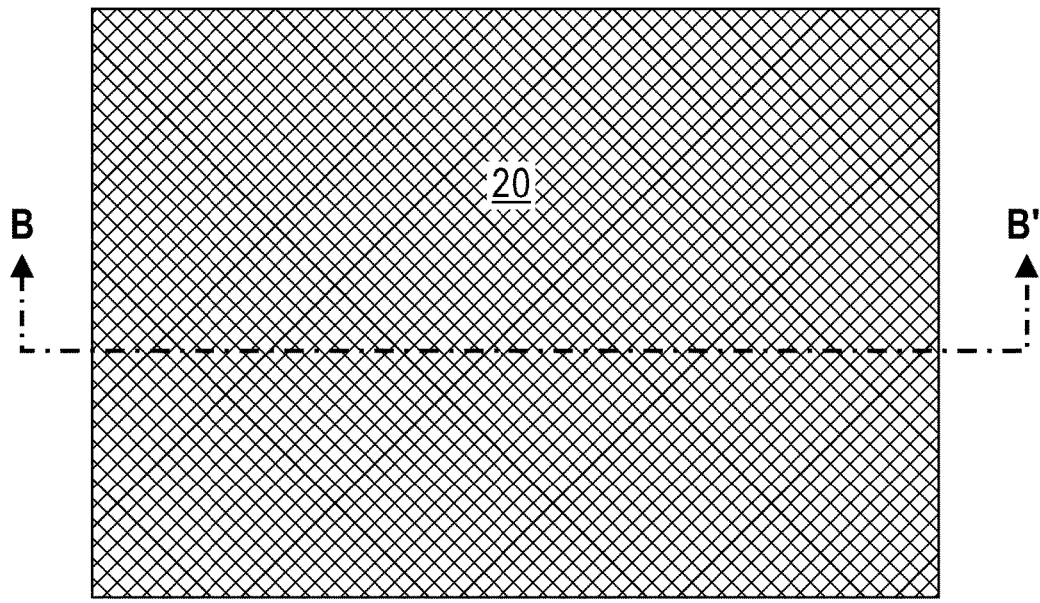
FIG. 2A is a top view of an exemplary semiconductor structure of FIGS. 1A and 1B after forming an insulator layer over top surface of the top semiconductor portion and the STI structure.
Figure 2B:
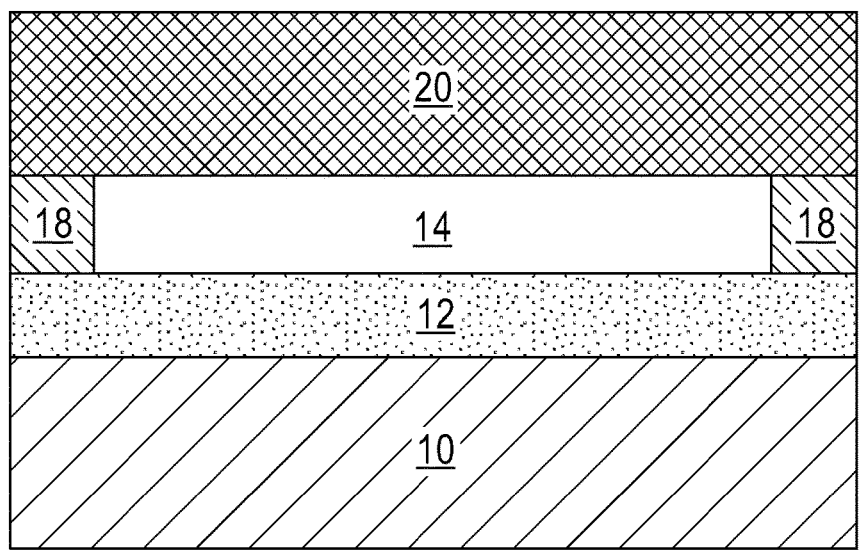
FIG. 2B is a cross-sectional view of the exemplary semiconductor structure along the vertical plane B-B' of FIG. 2A.

Referring to FIGS. 2A and 2B, an insulator layer 20 is formed on top surfaces of the top semiconductor portion 14 and the STI structure 18. The insulator layer 20 may include a dielectric material different from the dielectric material of the STI structure 18 such that the insulator layer 20 can be selectively removed relative to the STI structure 18 in a later processing step. For example and when the STI structure 18 includes silicon oxide, the insulator layer 20 can include silicon nitride or a composite of silicon oxide and silicon nitride. The insulator layer 20 may be formed utilizing a deposition process such as, for example, CVD or PECVD. The insulator layer 20 that is formed may have a thickness ranging from 20 nm to 200 nm, although lesser and greater thicknesses can also be employed.

Figure 3A:
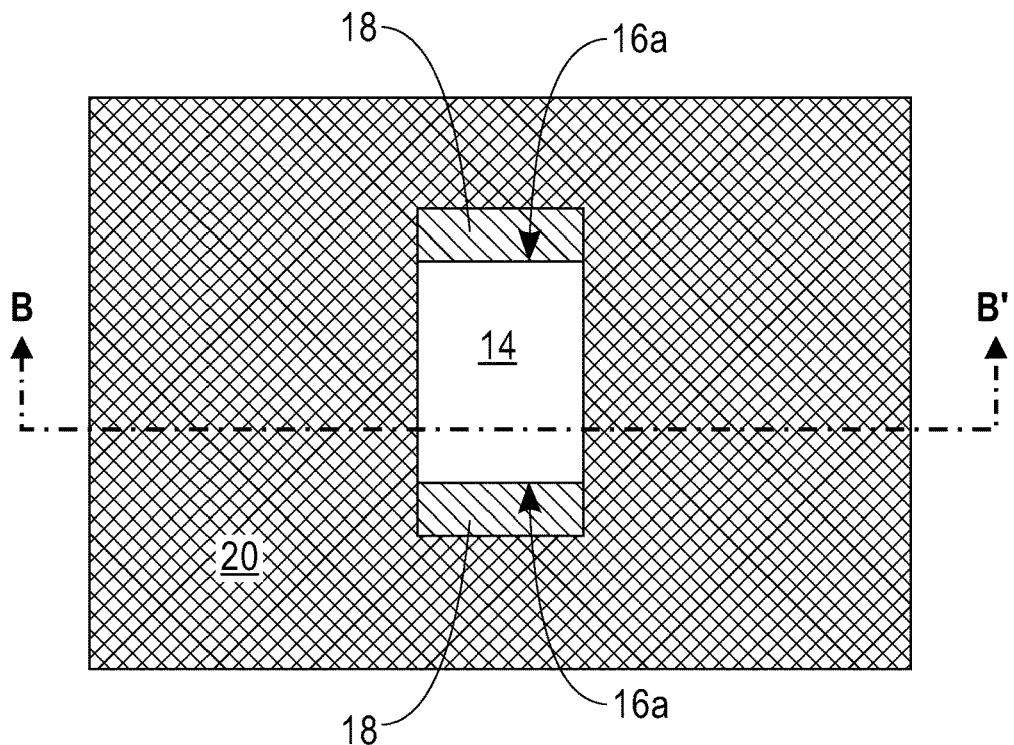
FIG. 3A is a top view of an exemplary semiconductor structure of FIGS. 2A and 2B after forming a first trench extending through the insulator layer
Figure 3B:
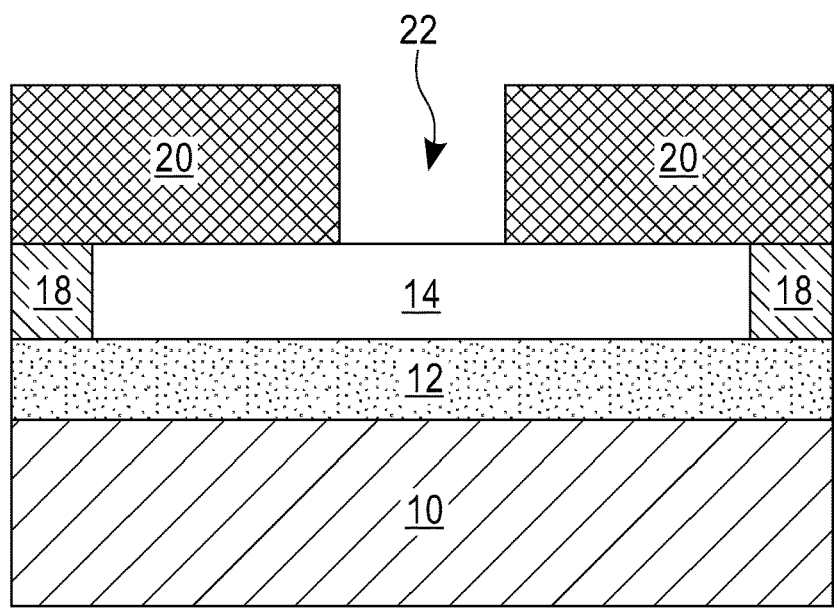
FIG. 3B is a cross-sectional view of the exemplary semiconductor structure along the vertical plane B-B' of FIG. 3A.

Referring to FIGS. 3A and 3B, the insulator layer 20 is patterned to form a first trench 22 therein. The first trench 22 extends through the insulator layer 20, thereby exposing a portion of the top surface of the top semiconductor portion 14. In one embodiment and as shown in FIG. 3A, the dimension of the first trench 22 is set such that the first trench 22 also exposes portions of the STI structure 18 adjoined to the first sidewalls 16a of the top semiconductor portion 14. The first trench 22 may be formed by applying a photoresist layer (not shown) over the insulator layer 20 and lithographically patterning the photoresist layer to form an opening therein. The pattern of the opening in the photoresist layer is then transferred into the insulator layer 20 by an anisotropic etch to form an opening in insulator layer 20. The anisotropic etch can be a dry etch such as, for example, RIE or a wet chemical etch. The remaining photoresist layer is subsequently removed, for example, by ashing.

Figure 4A:
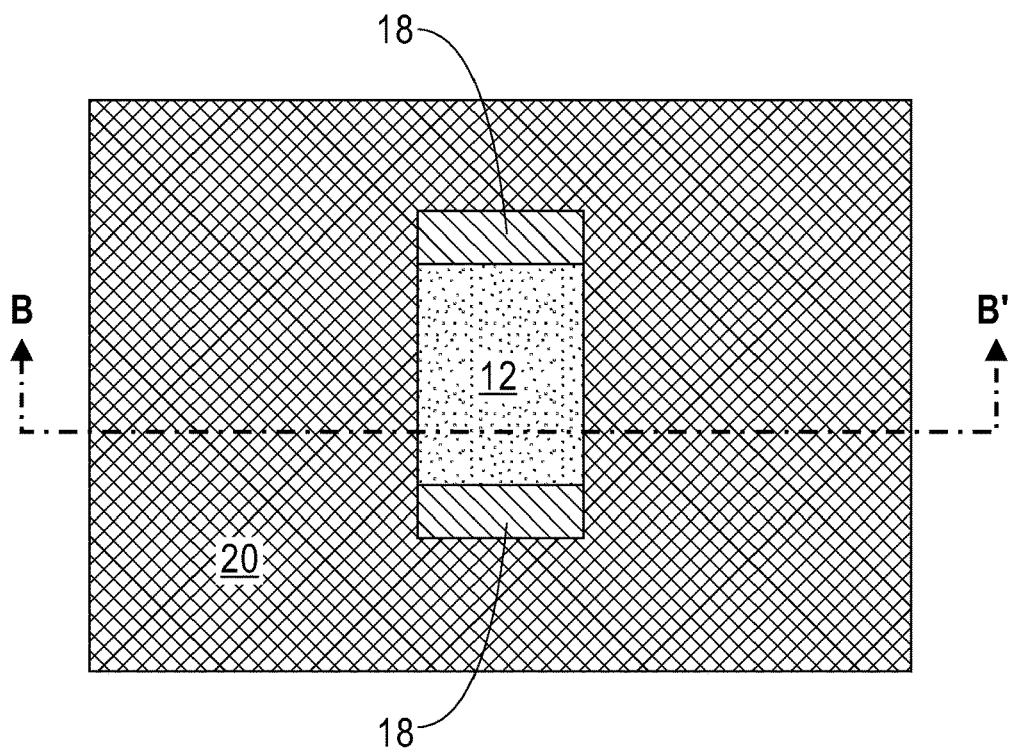
FIG. 4A is a top view of an exemplary semiconductor structure of FIGS. 3A and 3B after vertically expanding the first trench through the top semiconductor portion to provide a second trench.
Figure 4B:
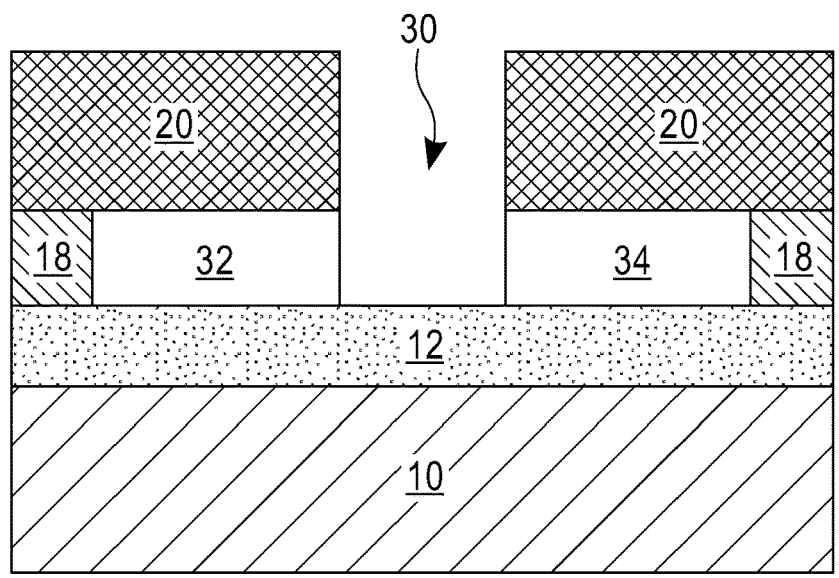
FIG. 4B is a cross-sectional view of the exemplary semiconductor structure along the vertical plane B-B' of FIG. 4A.

Referring to FIGS. 4A and 4B, the first trench 22 is vertically expanded through the top semiconductor portion 14 to form a second trench 30. The second trench 30 extends from the top surface of the insulator layer 20 and through the top semiconductor portion 14, thereby exposing the top surface of the buried insulator layer 12. The second trench 30 separates the top semiconductor portion 14 into two portions. A first portion of the top semiconductor portion 14 that is located at a first side of the second trench 30 constitutes an emitter 32 and a second portion of the top semiconductor portion 14 that is located at a second side of the second trench 30, opposite the first side, constitutes a collector 34 for a HBT. The vertical expansion of the first trench 22 can be performed by a second anisotropic etch that recesses the top semiconductor portion 14 employing the insulator layer 20 and the STI structure 18 as an etch mask. The second anisotropic etch can be a dry etch such as, for example, RIE or a wet chemical etch.

Figure 5A:
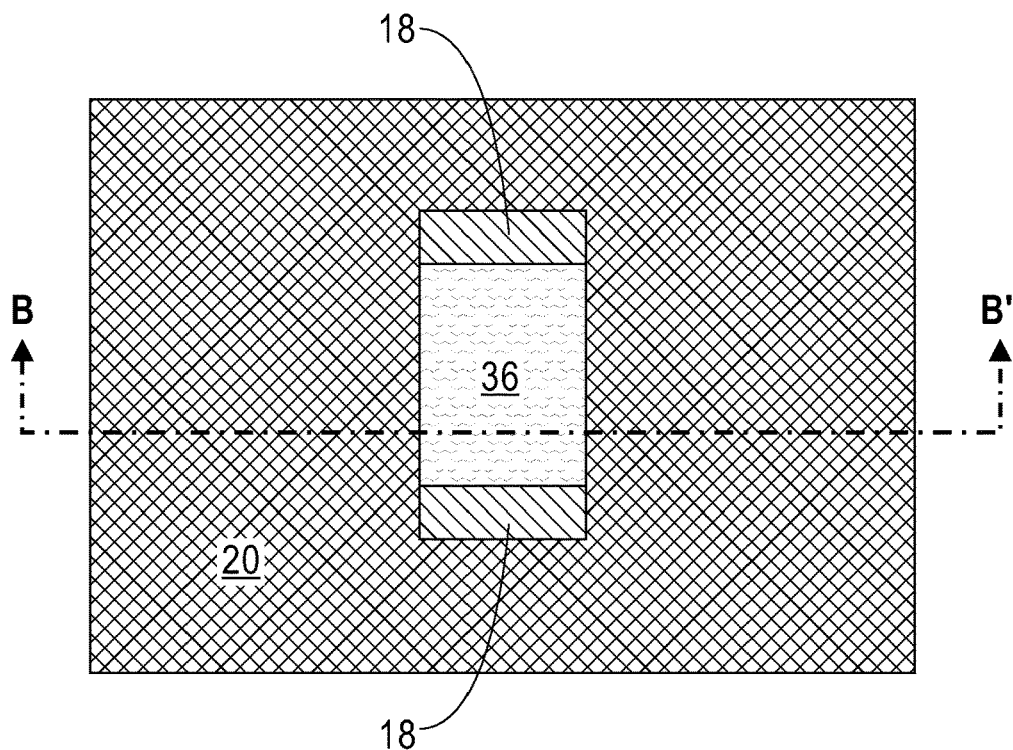
FIG. 5A is a top view of an exemplary semiconductor structure of FIGS. 4A and 4B after forming an intrinsic base within the second trench.
Figure 5B:
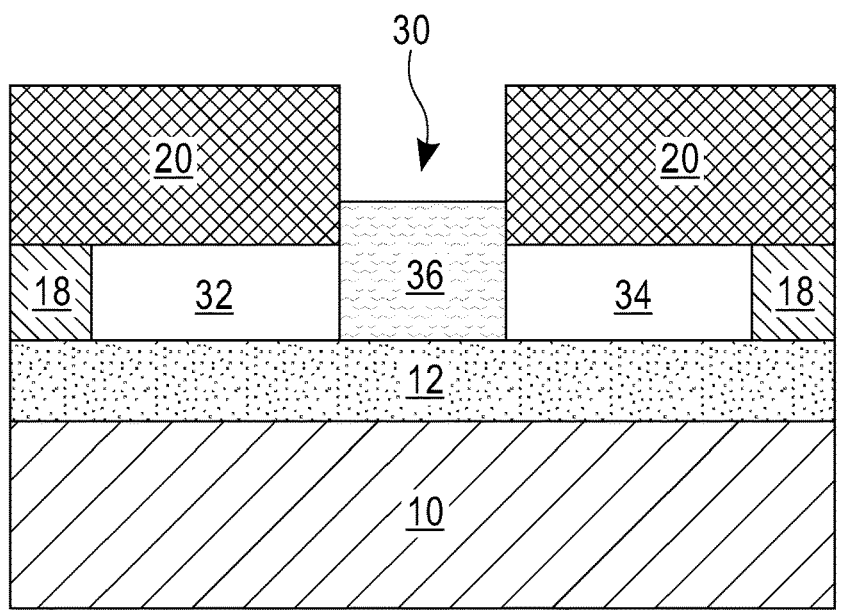
FIG. 5B is a cross-sectional view of the exemplary semiconductor structure along the vertical plane B-B' of FIG. 5A.

Referring to FIGS. 5A and 5B, an intrinsic base 36 is formed in the second trench 30 by a selective epitaxial growth process. The term "epitaxial growth and/or deposition" means the growth of a semiconductor material on a deposition surface of a semiconductor material, in which the semiconductor material being grown has the same (or nearly the same) crystalline characteristics as the semiconductor material of the deposition surface. During the selective epitaxial growth process, the semiconductor material grows only from exposed semiconductor surfaces, i.e., the physically exposed sidewall of the emitter 32 and the physically exposed sidewall of the collector 34, but not on dielectric surfaces, such as surfaces of the insulator layer 20, the STI structure 18 and the buried insulator layer 12. The selective epitaxial growth process is continued until a portion of the intrinsic base 36 protrudes above the emitter 32 and the collector 34 (i.e., a top surface of the intrinsic base 36 is located above a horizontal plane where the top surfaces of the emitter 32 and the collector 34 are located). The intrinsic base 36 thus formed is epitaxially aligned with the emitter 32 and the collector 34.

The intrinsic base 36 includes a doped semiconductor material with a dopant of a second conductivity type that is opposite to the first conductivity type. Thus, if a NPN-type heterojunction bipolar transistor is desired, the emitter 32 and the collector 34 have a doping of n-type, and the intrinsic base 36 has a doping of p-type. Conversely, if a PNP-type heterojunction bipolar transistor is desired, the top semiconductor portion 14 has a dopant of p-type, and the intrinsic base 36 has a dopant of n-type. The dopant concentration of the intrinsic base 36 can be from $1.0 \times 10^{17}$ atoms/cm$^3$ to $3.0 \times 10^{19}$ atoms/cm$^3$, although lesser and greater dopant concentrations can also be employed. The intrinsic base 36 may be doped in-situ during the epitaxial growth process or, alternatively, by a subsequent ion implantation process after growth of an intrinsic semiconductor material.

The intrinsic base 36 typically includes a semiconductor material having a bandgap less than the bandgap of the semiconductor material providing the emitter 32 and the collector 34, the resulting HBT can thus accommodate a greater current at a given emitter-base forward bias voltage. In one embodiment and when the emitter 32 and the collector 34 include Si, the intrinsic base 36 may include SiGe. A first heterojunction thus is present at a first interface between the emitter 32 and the intrinsic base 36, and a second heterojunction is present at a second interface between the collector 34 and the intrinsic base 36.

Figure 6A:
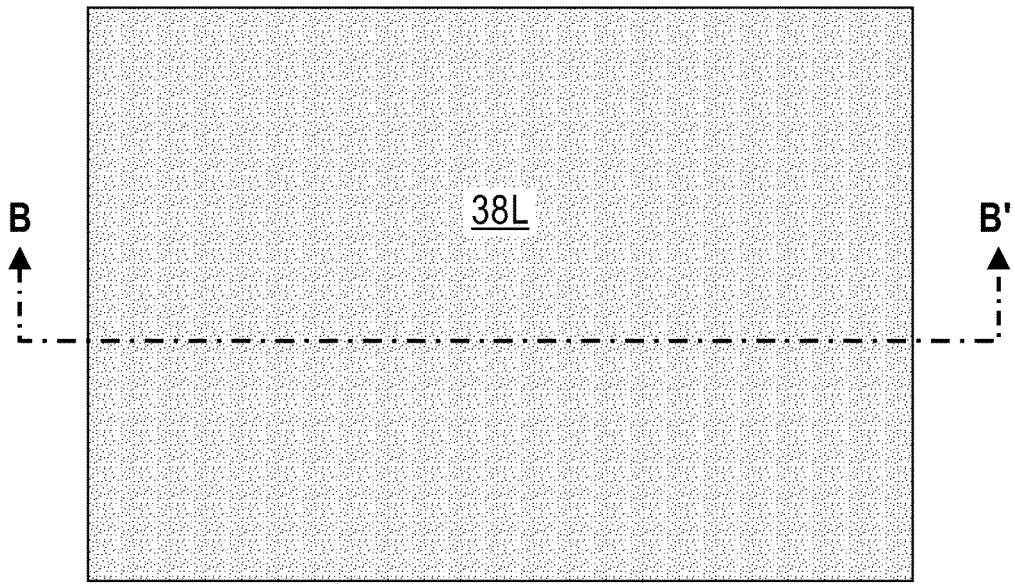
FIG. 6A is a top view of an exemplary semiconductor structure of FIGS. 5A and 5B after forming an extrinsic base layer over the intrinsic base and the insulator layer to completely fill the second trench.
Figure 6B:
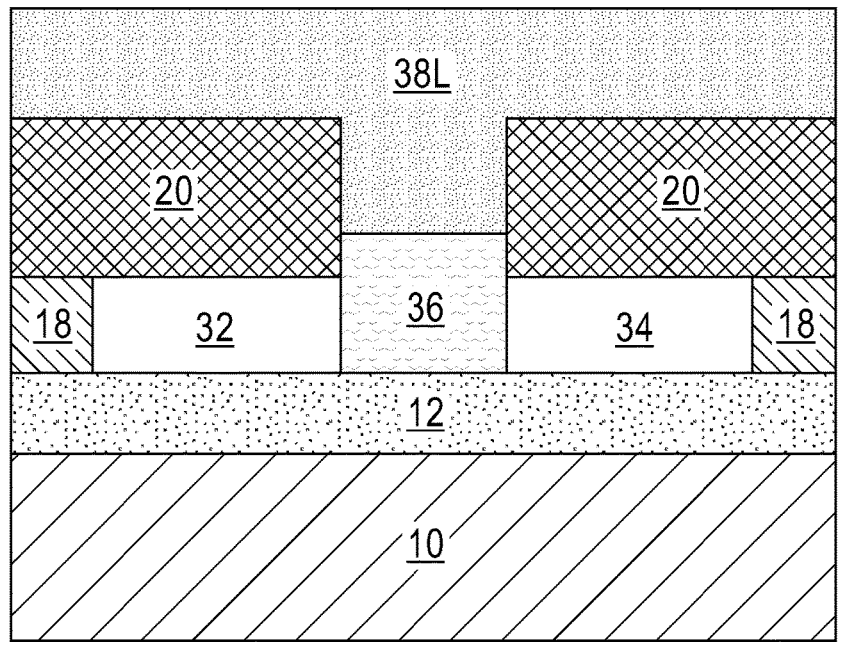
FIG. 6B is a cross-sectional view of the exemplary semiconductor structure along the vertical plane B-B' of FIG. 6A.

Referring to FIGS. 6A and 6B, an extrinsic base layer 38L is deposited over the intrinsic base 36 and the insulator layer 20 to completely fill the second trench 30. The extrinsic base layer 38L may include a doped semiconductor material with a dopant of the second conductivity type, which is the same as the conductivity type of the intrinsic base 36.

The extrinsic base layer 38L may include Si, SiGe, SiGeC, SiC, or a combination thereof. The extrinsic base layer 38L typically has a bandgap the same as or greater than the bandgap of the semiconductor material of the intrinsic base 36. In one embodiment and when the intrinsic base 36 includes SiGe, the extrinsic bas layer 38L may include Si. In another embodiment and when the intrinsic base 36 includes SiGe with a Ge concentration of 50%, the extrinsic base layer 38L may include SiGe with a Ge concentration less than 50%. In one embodiment, the extrinsic base layer 38L can be polycrystalline.

The dopant concentration in the extrinsic base layer 38L can be from $5\times10^{18}$ atoms/cm$^3$ to $5\times10^{21}$ atoms/cm$^3$, although lesser and greater dopant concentrations can also be employed. Typically, the extrinsic base layer 38L has a dopant concentration greater than the dopant concentration of the intrinsic base 36. In instances where the extrinsic base layer 38L has a dopant concentration at least five times greater than the dopant concentration in the intrinsic base 36, the semiconductor material providing the extrinsic bas layer 38L can have a bandgap the same as the bandgap of the semiconductor material providing the intrinsic base 36. The greater dopant concentration and the greater bandgap of the extrinsic base layer 38L have the same effect in reducing the flow of minority carriers in the intrinsic base 36 into the extrinsic base subsequently formed from the extrinsic base layer 38L. In the case of an NPN HBT, the greater dopant concentration and the greater bandgap of the extrinsic base have the same effect in reducing the flow of electrons from the intrinsic base 36 into the extrinsic base. In the case a PNP HBT, the greater dopant concentration and the greater bandgap of the extrinsic base have the same effect in reducing the flow of holes from the intrinsic base 36 into the extrinsic base.

The extrinsic base layer 38L may be formed, for example, by CVD. In one embodiment, the extrinsic base layer 38L can be deposited with in-situ doping that incorporates dopants of the second conductivity type during deposition. In another embodiment, the extrinsic base layer 38L can be deposited as an intrinsic semiconductor material and subsequently implanted with dopants of the second conductivity type.

The extrinsic base layer 38L is deposited to a thickness such that a top surface of the extrinsic base layer 38L is located above the top surface of the insulator layer 20. The thickness of the extrinsic base layer 38L can be from 20 nm to 300 nm, although lesser and greater thicknesses can also be employed.

In the present application, the extrinsic base layer 38L is formed by a conventional deposition method, rather than a selective epitaxial growth process. Such deposition allows depositing a thicker film over the intrinsic base 36 when a wider bandgap semiconductor material is employed as the extrinsic base layer 38L which has a lattice mismatch with the semiconductor material providing the intrinsic base 36, because there is no strain build-up in the intrinsic base 36 and the extrinsic base layer 38L.

Figure 7A:
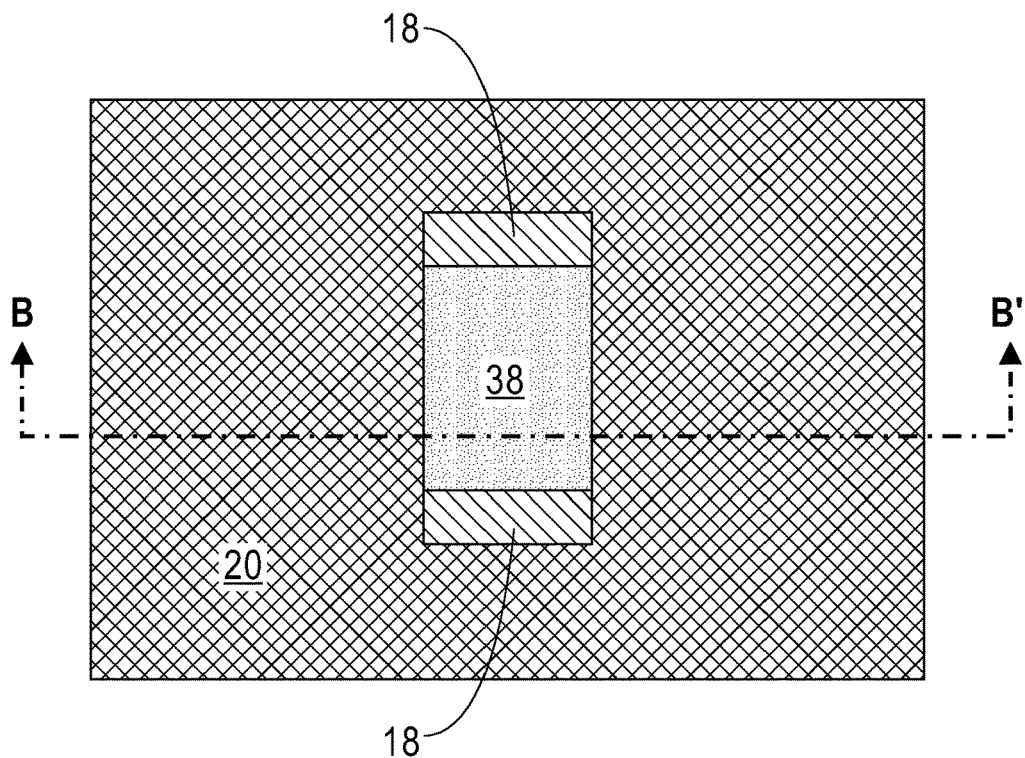
FIG. 7A is a top view of an exemplary semiconductor structure of FIGS. 6A and 6B after forming an extrinsic base.
Figure 7B:
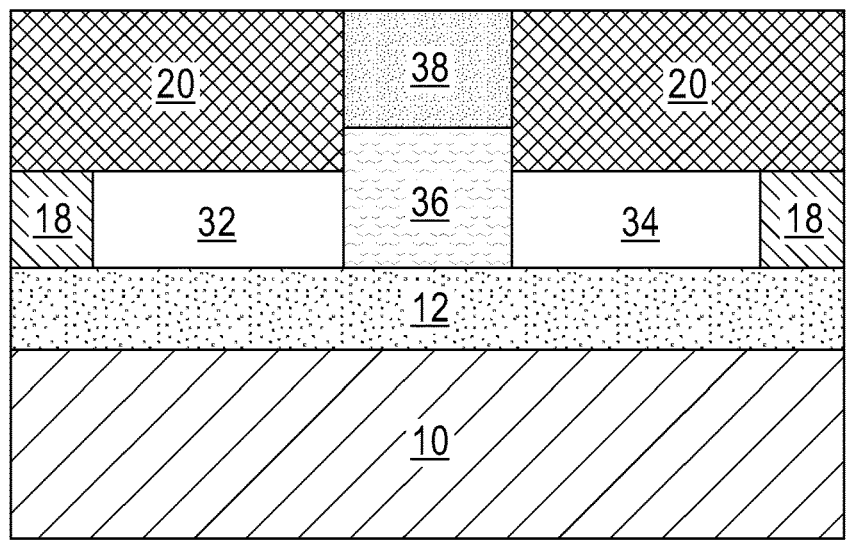
FIG. 7B is a cross-sectional view of the exemplary semiconductor structure along the vertical plane B-B' of FIG. 7A.

Referring to FIGS. 7A and 7B, a portion of the extrinsic base layer 38L that is located above the top surface of the insulator layer 20 is removed, for example, by CMP. The remaining portion of the extrinsic base layer 38L located within the second trench 30 constitutes an extrinsic base 38. The extrinsic base 38 has a top surface coplanar with the top surface of the insulator layer 20. The sidewalls of the extrinsic base 38 are vertically coincident with the sidewalls of the intrinsic base 36. The extrinsic base 38 is thus self-aligned with the intrinsic base 36 in both the lengthwise direction and the widthwise direction and does not overlap with the emitter 32 and the collector 34. In the present application, because there are no overlaps between the extrinsic base 38 and the emitter 32 as well as the extrinsic base 38 and the collector 34, the parasitic capacitance between junctions can be minimized. As a result, the switching speed of the HBT can be increased.

Figure 8A:
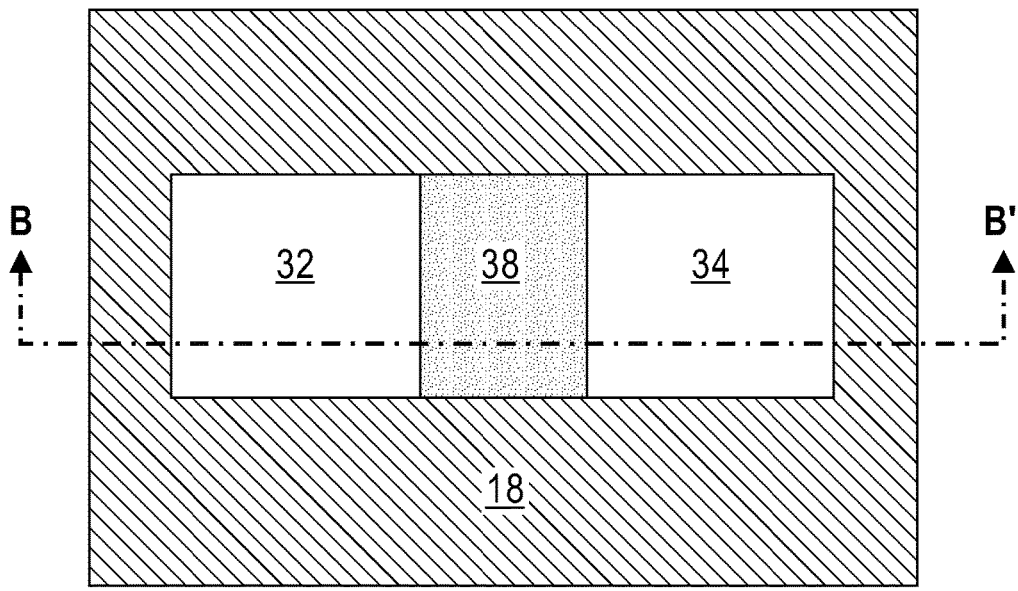
FIG. 8A is a top view of an exemplary semiconductor structure of FIGS. 7A and 7B after removing the insulator layer.
Figure 8B:
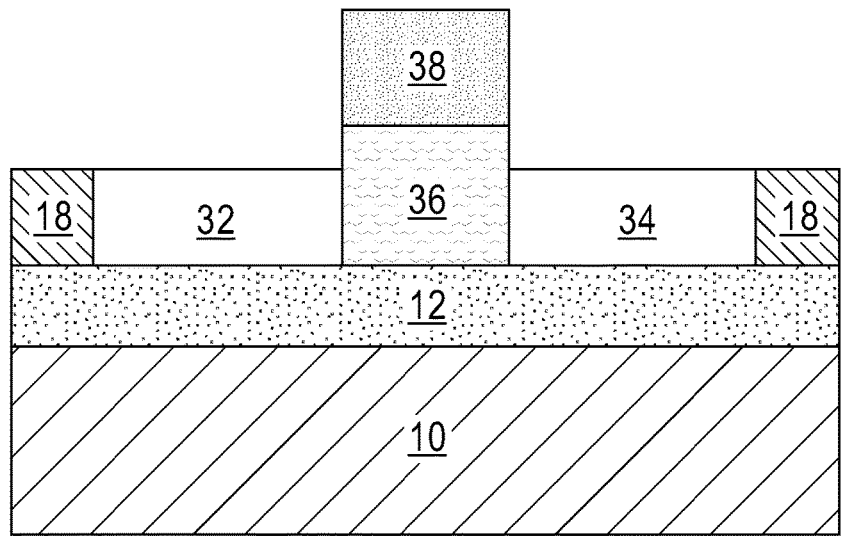
FIG. 8B is a cross-sectional view of the exemplary semiconductor structure along the vertical plane B-B' of FIG. 8A.

Referring to FIGS. 8A and 8B, the insulator layer 20 is removed from the top surfaces of the STI structure 18, the emitter 32 and the collector 34. The insulator layer 20 can be removed by a dry etch such as, for example, RIE or a wet chemical etch. The removal of the insulator layer 20 exposes the emitter 32 and the collector 34.

Figure 9A:
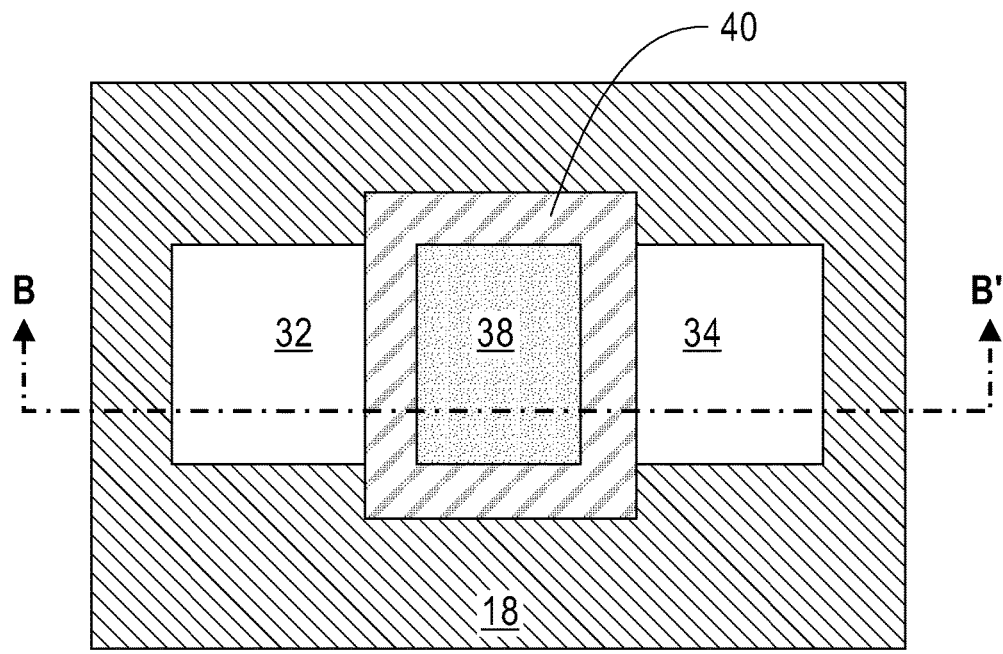
FIG. 9A is a top view of an exemplary semiconductor structure of FIGS. 8A and 8B after forming a spacer on sidewalls of the extrinsic base and an upper portion of intrinsic base.
Figure 9B:
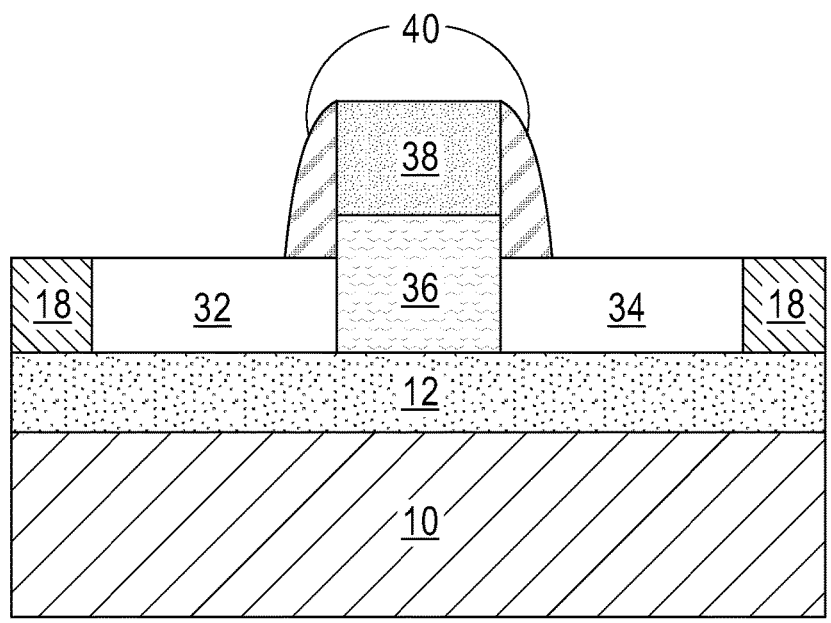
FIG. 9B is a cross-sectional view of the exemplary semiconductor structure along the vertical plane B-B' of FIG. 9A.

Referring to FIGS. 9A and 9B, a spacer 40 is formed on sidewalls of the extrinsic base 38 and the protruding portion of intrinsic base 36. The spacer 40 can be formed by depositing a conformal dielectric material layer (not shown) over exposed surfaces of the extrinsic base 38, the protruding portion of the intrinsic base 36, the emitter 32, the collector 34 and the STI structure 18 utilizing CVD or atomic layer deposition (ALD). An anisotropic etch is subsequently performed to remove horizontal portions of the conformal dielectric material layer. The remaining vertical portions of the conformal dielectric material layer after the anisotropic etch form the spacer 40 that laterally surrounds the stack of the protruding portion of the intrinsic base 36 and the extrinsic base 38. The spacer 40 includes a dielectric material such as silicon oxide, silicon nitride, silicon oxynitride, or a combination thereof. The thickness of the spacer 40, as measured laterally at a bottom portion that contacts the top surfaces of the emitter 32 and the collector 34, can be from 5 nm to 100 nm, although lesser and greater thicknesses can also be employed.

While the methods and structures disclosed herein have been particularly shown and described with respect to preferred embodiments thereof, it will be understood by those skilled in the art that the foregoing and other changes in forms and details may be made without departing from the spirit and scope of the present application. It is therefore intended that the methods and structures disclosed herein not be limited to the exact forms and details described and illustrated, but fall within the scope of the appended claims.

What is claimed is:

1. A semiconductor structure comprising:
    an emitter and a collector spaced apart from each other and located on a buried insulator layer, wherein the emitter and the collector comprise a first semiconductor material of a first conductivity type;
    an intrinsic base comprising a second semiconductor material of a second conductivity type opposite to the first conductivity type disposed in between the emitter and the collector and on the buried insulator layer, wherein a portion of the intrinsic base protrudes above the emitter and the collector; and
    an extrinsic base comprising a third semiconductor material of the second conductivity type disposed on a top surface of the intrinsic base, wherein outermost sidewalls of the extrinsic base are vertically aligned with outermost sidewalls of the intrinsic base.

2. The semiconductor structure of claim 1, wherein a top surface of the intrinsic base is located above top surfaces of the emitter and the collector.

3. The semiconductor structure of claim 1, wherein the second semiconductor material has a bandgap less than a bandgap of the first semiconductor material.

4. The semiconductor structure of claim 3, wherein the first semiconductor material comprises silicon, and the second semiconductor material comprises silicon germanium.

5. The semiconductor structure of claim 1, wherein the first conductivity type is n-type, and the second conductivity type is p-type.

6. The semiconductor structure of claim 1, wherein a first lateral heterojunction is present at a first interface between the emitter and intrinsic base, and a second lateral heterojunction is present at a second interface between the collector and the intrinsic base.

7. The semiconductor structure of claim 1, wherein the buried insulator layer is located on a handle substrate of a semiconductor-on-insulator (SOI) substrate.

8. The semiconductor structure of claim 1, further comprising a spacer present on sidewalls of the extrinsic base and sidewalls of the protruding portion of the intrinsic base.

9. The semiconductor structure of claim 1, wherein a base of the spacer located on one side of the extrinsic base and the protruding portion of the intrinsic base is located directly on a topmost surface of the emitter, and wherein a base of the spacer located one another side of the extrinsic base and the protruding portion of the intrinsic base is located directly on a topmost surface of the collector.

10. The semiconductor structure of claim 1, further comprising a shallow trench isolation (STI) structure located on the buried insulator layer and laterally surrounding and contacting the emitter, the collector and the intrinsic base.

11. The semiconductor structure of claim 10, wherein the STI structure has a topmost surface that is coplanar with a topmost surface of both the emitter and the collector.

12. The semiconductor structure of claim 1, wherein the emitter has a topmost surface that is coplanar with a topmost surface of said collector.

13. The semiconductor structure of claim 1, wherein the extrinsic base does not overlap with the emitter and the collector.

14. The semiconductor structure of claim 1, wherein the first semiconductor material comprises silicon germanium having a germanium content of 50%, while the second semiconductor material comprises silicon germanium having a germanium content of less than 50%.

15. The semiconductor structure of claim 1, wherein the extrinsic base is polycrystalline.

16. The semiconductor structure of claim 1, wherein the intrinsic base has a same crystal structure as the emitter and the collector.

17. The semiconductor structure of claim 1, wherein the emitter, intrinsic base, and the collector have bottommost surfaces that are coplanar with each other.

18. The semiconductor structure of claim 1, wherein the first conductivity type is p-type, and the second conductivity type is n-type.

* * * * *